US006448846B2

(12) United States Patent
Schwartz

(10) Patent No.: US 6,448,846 B2
(45) **Date of Patent: *Sep. 10, 2002**

(54) CONTROLLED PHASE-CANCELING CIRCUITS/SYSTEMS

(75) Inventor: Stephen R. Schwartz, 172 Congdon St., Providence, RI (US) 02906

(73) Assignee: Stephen R. Schwartz, Providence, RI (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/164,875

(22) Filed: Oct. 1, 1998

(51) Int. Cl.[7] ............................ H03H 7/20; H04B 1/10

(52) U.S. Cl. ........................................ 327/555; 327/361

(58) Field of Search ................................ 327/361, 551, 327/552, 553, 554, 555, 556, 557, 558, 559; 381/97

(56) References Cited

U.S. PATENT DOCUMENTS

| | | | | | |
|---|---|---|---|---|---|
| 3,803,357 | A | * | 4/1974 | Sacks | 381/94.8 |
| 3,846,719 | A | * | 11/1974 | Dolby | 330/126 |
| 3,995,235 | A | | 11/1976 | Kaplan | 381/97 |
| 4,316,060 | A | * | 2/1982 | Adams et al. | 381/98 |
| 4,484,345 | A | * | 11/1984 | Stearns | 381/98 |
| 4,701,722 | A | * | 10/1987 | Dolby | 333/14 |
| 4,703,507 | A | * | 10/1987 | Holden | 381/94.5 |
| 4,866,774 | A | * | 9/1989 | Klayman | 381/1 |
| 4,908,858 | A | | 3/1990 | Ohno | 381/1 |
| 4,972,489 | A | | 11/1990 | Oki et al. | 381/97 |
| 4,973,915 | A | * | 11/1990 | Batey | 330/151 |
| 5,105,462 | A | | 4/1992 | Lowe et al. | 381/17 |
| 5,177,801 | A | | 1/1993 | Shoda et al. | 381/119 |
| 5,228,093 | A | | 7/1993 | Agnello | 381/119 |
| 5,235,646 | A | | 8/1993 | Wilde et al. | 381/17 |
| 5,285,165 | A | * | 2/1994 | Renfors et al. | 327/552 |
| 5,815,037 | A | * | 9/1998 | Tomasini et al. | 330/69 |
| 5,850,453 | A | * | 12/1998 | Klayman et al. | 381/1 |

* cited by examiner

*Primary Examiner*—Timothy P. Callahan
*Assistant Examiner*—Terry L. Englund
(74) *Attorney, Agent, or Firm*—Kenyon & Kenyon

(57) ABSTRACT

By taking advantage of the ability to control the phase relationship between a processor's output (or portions of a processor's output) and the phase of the pre-processed signal (in a particular frequency range or ranges, a controlled accentuation or enhancement of the processor's effect can be realized. In one embodiment this is achieved by providing a gain control circuit that receives and selectively amplifies the input signal prior to it being summed with the processor's output.

40 Claims, 8 Drawing Sheets

CONTROLLED PHASE-CANCELING CIRCUITS/SYSTEMS

BACKGROUND OF THE INVENTION

The present invention pertains to a method and apparatus for reducing the level of at least a portion of a signal's frequency spectrum. More particularly, the present invention pertains to a method and apparatus for enhancing/intensifying the effect of at least one frequency band which has previously been chosen for a reduction in level.

A category of processors for altering the level of selected portions of an input signal that may have been converted to electronic analog or digital signals is known in the art. When dealing with signals in the "audio" frequency range (approximately between 20 Hz–20 kHz) for data such as music (or other audio sound), the category includes devices known as filters, equalizers, and tone controls.

FILTER SHAPES AND BANDS (STOP, PASS, and TRANSITION)—Filters are often descibed as having certain shapes, which consist of regions called bands. The four most common filter shapes are known as hi-pass, low-pass, band-pass, and band-reject (also called 'notch'). Each of these filter shapes have areas (or bands) of the frequency spectrum that are affected (where the filter shape reduces the signal, or tries to stop it), and areas that are not affected (where the filter shape lets the signal pass through). A reduced area is called a "STOP-BAND" (i.e., the signal is stopped). An untouched area is called a "PASS-BAND" (i.e., the signal is allowed to pass). There is always an area of transition between a passband and a neighboring stopband, herein called a "TRANSITION BAND."

SOME PHASE CHARACTERISTICS OF WAVES—Wave energy (such as sound energy, alternating electrical signals, etc.) is often modeled as having peaks and troughs. Roughly speaking, a peak is where energy is at a maximum of pushing, a trough is at a maximum of pulling back, and in between the energy is shifting back and forth between this pushing and pulling.

Two identical (or very similar) waves combined in certain ways produce particular results. For the simple example of a pair of identical sine waves, some basic combinations include:

- "IN PHASE" combination=phase difference of 0 degrees=when their high and low points (peaks and troughs) occur at the same time. Since they are pushing and pulling in the same direction, playing the two waves together like this doubles the energy, which sounds louder than one wave alone.
- "OUT OF PHASE" combination=phase difference of 180 degrees=when the high point of one wave combines with the low point of the other. When out of phase, one is pushing while the other is pulling. Playing two identical waves together like this completely cancels the energy. The result is complete silence. BETWEEN 0 AND 180 DEGREES: Between 0 and 180 degrees, the two waves played together will sometimes push-pull together and sometimes push-pull in opposition. At a phase difference of 120 degrees, the resulting energy is the same amount as if only one wave was playing. As you choose phase relationships going from 0 to 180 degrees, the total energy of the two waves combined gets smaller. There is double energy at 0 degrees phase (in phase); it gets gradually less until it reaches single energy at 120 degrees phase, and continues to get gradually less until it reaches zero energy at 180 degrees phase (out of phase). From 180 to 360 degrees, the process reverses (gradually gets louder).

For example, in the audio engineering field, one often mixes signals, e.g. adds a bass drum microphone's output to other microphone signals present. It is known in the art that the various distances from each microphone may cause phase differences that can, at certain frequencies, cause cancellations, and so affect the tone quality of the bass drum. Many audio mixing consoles, therefore, with switches that allow changing each microphone's phase by 180 degrees (="reversing phase"), which is often helpful in correcting for these microphone placement problems.

SUMMARY OF THE INVENTION

A method and apparatus of the present invention makes constructive use of the phase canceling effect. In an embodiment of the present invention, a device can be constructed so that one or more of the post-processor stopbands are 180 degrees out of phase with the original (pre-processor) signal, while one or more of the post-processor passbands remain in phase (0 degrees) with the original pre-processor level. By mixing the above post-processor signal with the original pre-processor signal in approximately equal amounts, the in-phase passbands end up being somewhat louder (the greatest available increase with no added pre-processor gain is 2×). The out-of-phase stopbands become significantly reduced because the phase cancellation allows a (theoretically) infinite decrease. The present invention makes constructive use of this effect, and provides many benefits, which include:

- an enhancement/extension/magnification of the processor's effect, often beyond the ability of the processor itself,
- an ability to provide a variable "Q"/depth for circuits, some of which are normally difficult to do so, by allowing a variable slope/depth adjustment to a processor's stop bands,
- the possibility of providing a continuum from plain post-processor output to enhanced processing to no processing, all via a single control (it can also be automated for a particular setting, notably maximum enhancement).

An example of use with the single control embodiment is described below. Assume the processing involves two equalizers, one set to reduce frequencies below 200 Hz, the other set to reduce the frequencies between 2 kHz and 3 kHz. With the control set to include none of the pre-processor signal (fully 'off'), one sets each processor element to a desired sound. As the phase cancellor control is turned to gradually add pre-processor signal, the listener notices an enhancement of the processor's effect (due to the increasing phase cancellation in the stop-bands, as explained below). There will gradually be even less and less signal below 200 Hz, and less and less signal between 2 kHz and 3 kHz, until a maximum cut is reached where the control is set so that the pre- and post-processor signal mix is about even. As the control is used to add more pre-processor signal beyond that point, the regions of reduction become LESS reduced. Eventually, the pre-processor signal overwhelms the post-processor signal, until the signal is, in practice, the same as the original pre-processor output (an arrangement can be made to make it a purely pre-processor signal).

The single phase-canceling control as described can serve several purposes. Although one can make processors that have as much cut as that produced by the phase cancellation method, they are often difficult or expensive; for many filter types, having a variable cut like this would be very difficult to produce. Also, tuning with a processor with a very steep cut is often not intuitive, so this two step method (process, then enhance) is often easier to do (though some filter types commonly include the two-step method achieved another way). And since the cancellation occurs because of RELATIVE signal phase, a single phase-cancelling control can work to produce this cancellation with an entire group of processor elements: note that in the example above, the two equalizing processors are first tuned individually, whereas the enhancement to (and control of) both takes place simultaneously. In particular, this 'global' nature of the present invention, the ability to control the intensity of an ENTIRE GROUP of processors with a single knob, is a previously unavailable effect that has an intuitive result and is easy to use.

DETAILED DESCRIPTION

Figure 1:
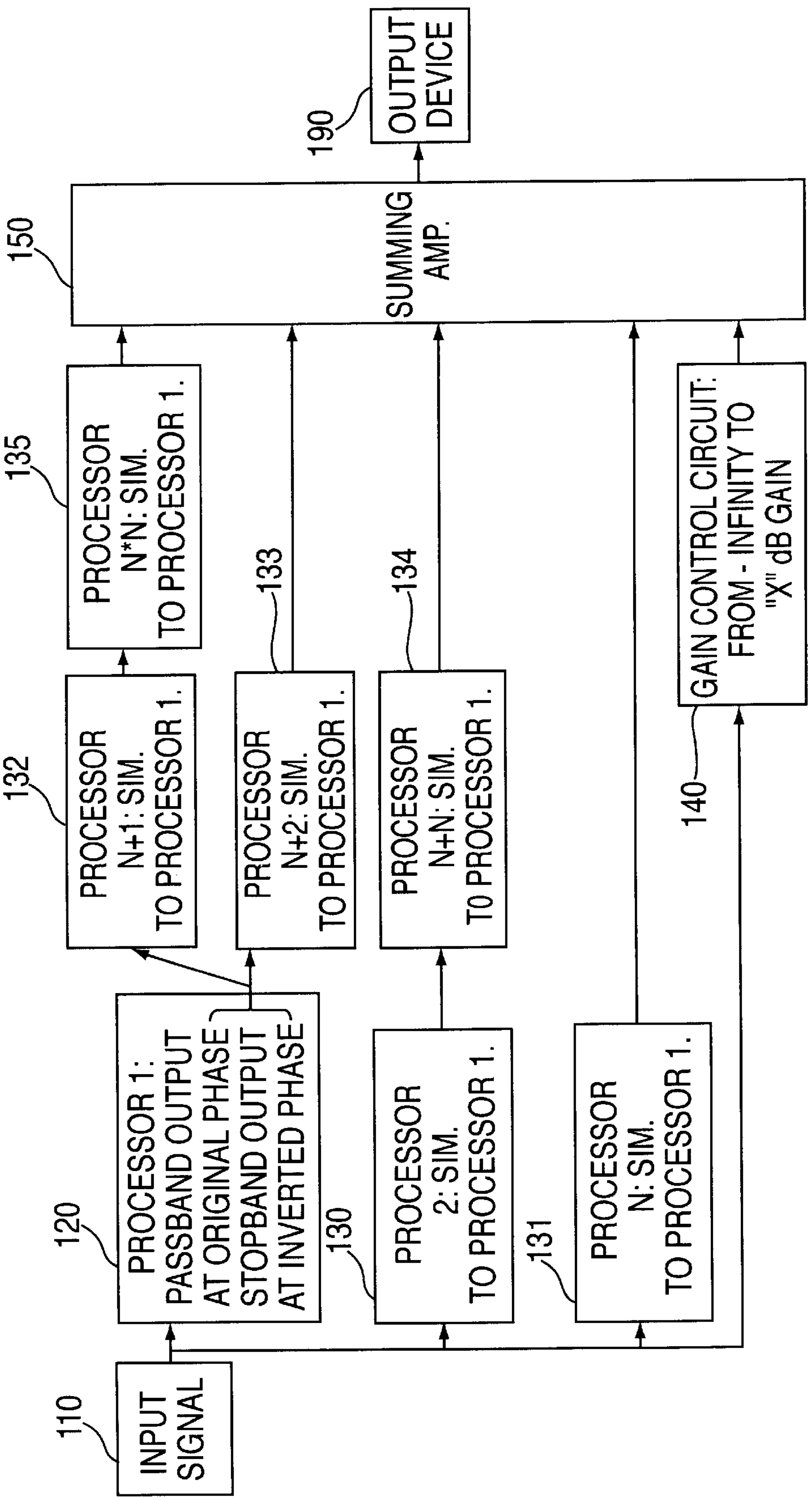
FIG. 1 is a general block diagram of an apparatus constructed according to an embodiment of the present invention.

Referring to FIG. 1, a block diagram of an apparatus for performing phase cancellation according to an embodiment of the present invention is shown. The phase cancellation can be referred to as performing the following steps:

1. For those portions of the frequency spectrum output by the processors (120, 130, 131, 132, 133, 134, 135) which are desired (i.e., the passband(s)Y and are therefore kept in phase with the input signal, those portions will add to their like portions of the frequency spectrum in the signal output by gain control circuit 140, producing an increase in the level of those portions. As used herein, gain control includes amplification and/or attenuation of a signal.

2. For those portions of the frequency spectrum output by the processors (120, 130, 131, 132, 133, 134, 135) which are not desired (the stopband(s)) and are therefore made to be out of phase with the input signal, those portions will cancel/subtract from their like portions of the frequency spectrum in the signal output by gain control circuit 140, producing a decrease in the level of those portions.

Input signal 110 is provided to at least one processor 120 where the signal is modified. For example, the signal can be modified by a processor which decreases the level of a portion of the frequency band of the signal (e.g., as; in an audio filter). Input signal 110 is also provided to a gain control circuit 140, which supplies an independent source of the unaltered input signal, but with a level control. The outputs of the processor(s) 120 . . . and the gain control circuit 140 are mixed by summing amplifier circuit 150. If desired, the phase cancelled signal can be provided to an output device 190, such as a recording device, speaker, etc.

Figure 2:
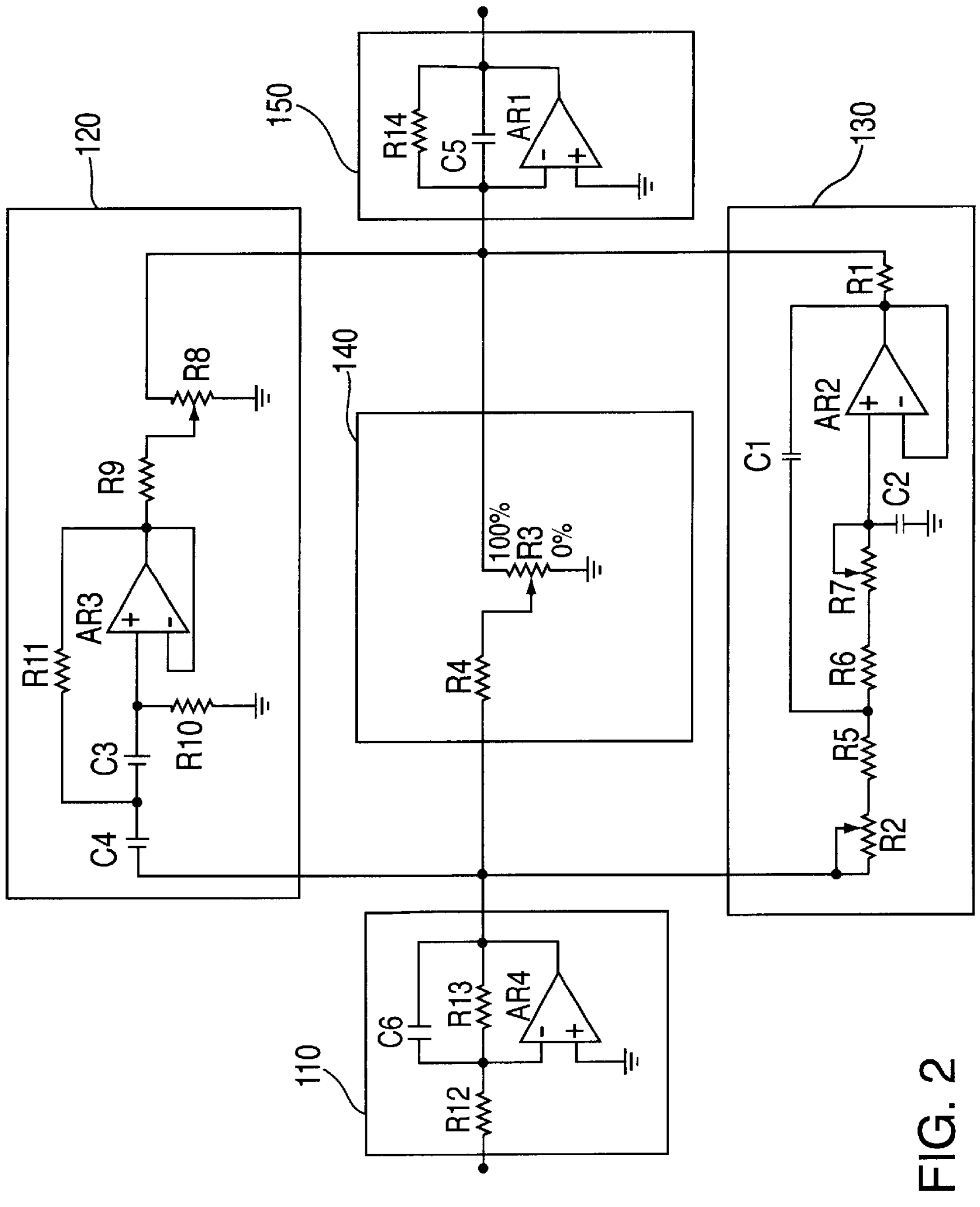
FIG. 2 is a detailed circuit diagram for an embodiment of the apparatus of FIG. 1.

In the example of FIG. 2, the input signal 110 is passed through an optional gain amplifier 110. It is known in the art that a device which filters a region of frequencies can easily be constructed. It is also known in the art to construct such filters so that the stopband (filtered region) becomes out of phase in relationship to the original signal, while the passband (unfiltered region) remains in phase with the original signal. Examples of such circuits are shown in FIG. 2 as elements 120 (a fixed pole high-pass filter with an output volume control) and 130 (a variable frequency low-pass filter).

Figure 3:
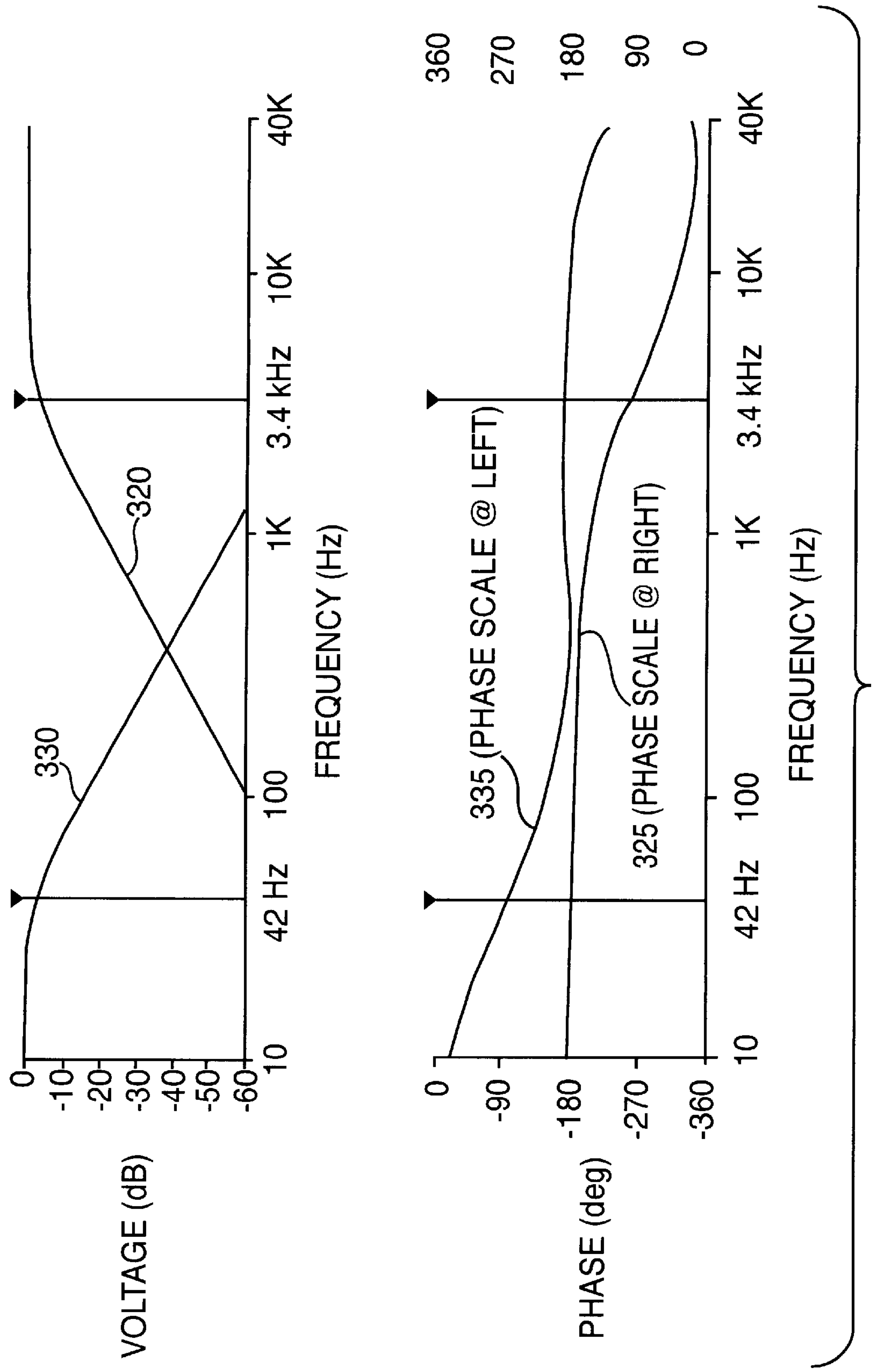
FIG. 3 is a pair of graphs which show the frequency response for the filters of FIG. 2, and the phase difference between the signal at the input and output of these filters of FIG. 2 .

FIG. 3 shows the phase relationships between the preprocessor signal of 140 (0 degrees) and the post-processor signals of 120 (line 325) and 130 (line 335). The scale for line 335's phase degree is at the left side, and the scale for line 325's phase degree is at the right side. The frequency response of low pass filter 130 (FIG. 2) is seen as line 330, whereas its phase is seen as line 335 (scale at left). Similarly, the frequency response of high pass filter 120 (FIG. 2) is seen as line 320, whereas its phase is seen as line 325 (scale at right). The signals of the two filters are combined by summing amp 150. The topmost curve of FIG. 4A, where R3=0%, shows the resulting frequency response (sub-circuit 140 has no effect on the output when its potentiometer R3 is set to 0%). In the example of FIG. 2, gain control circuit 140 is shown as a simple passive device. Some embodiments may benefit from an active device and/or other configurations. The output of circuit 140 has a phase of 0 degrees by definition, and is provided to summing amp 150 along with the outputs of circuits 120 and 130. As R3 of 140 is increased from its "0%" position, more of the pre-processor signal is added to the post-processor signals by the summing amp.

Figure 4A:
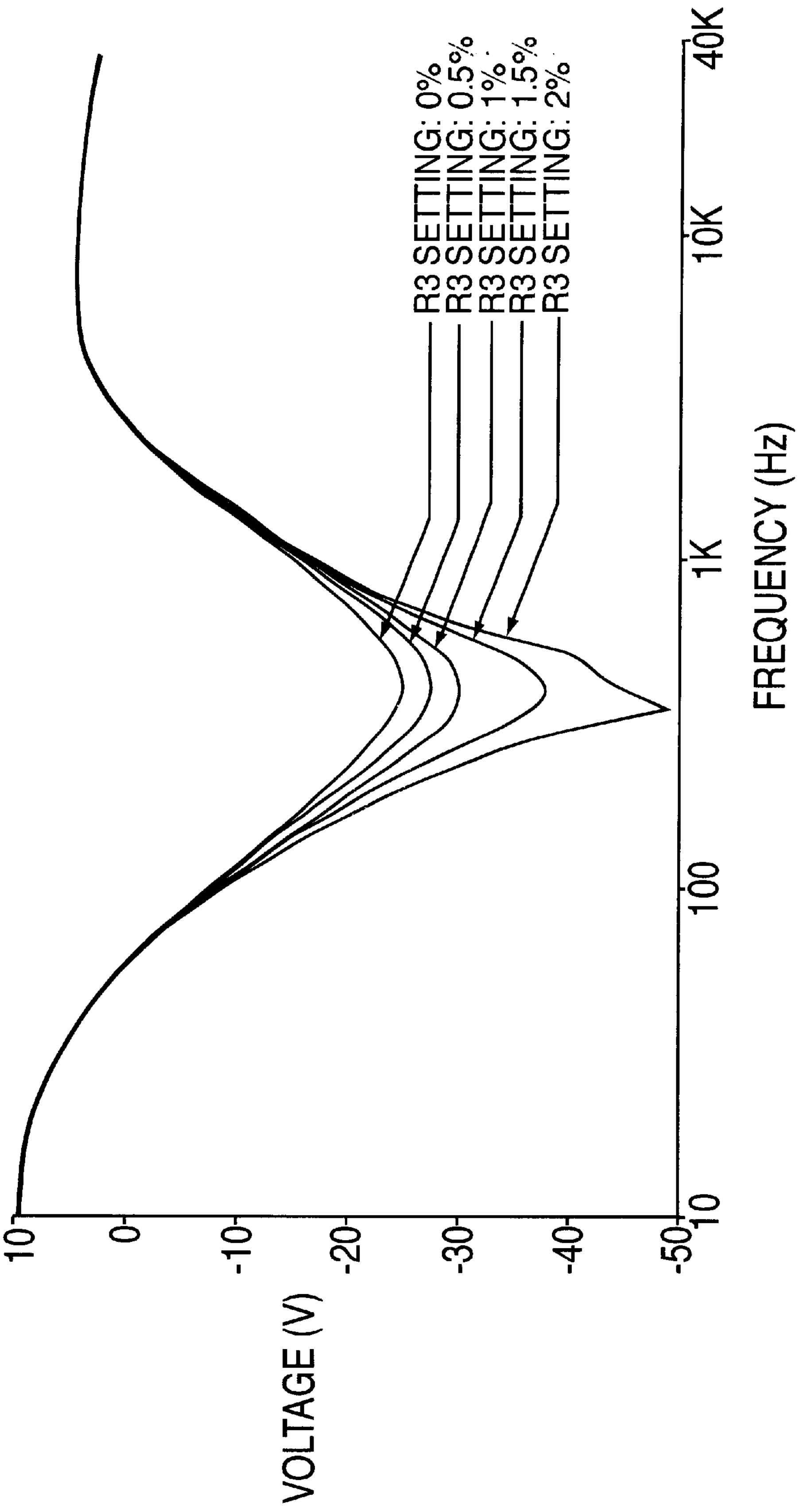
FIG. 4A is a graph which shows the output of the circuit of FIG. 2 while R3 is varied from 0% (no cancellation) to 2% (maximum cancellation).
Figure 4B:
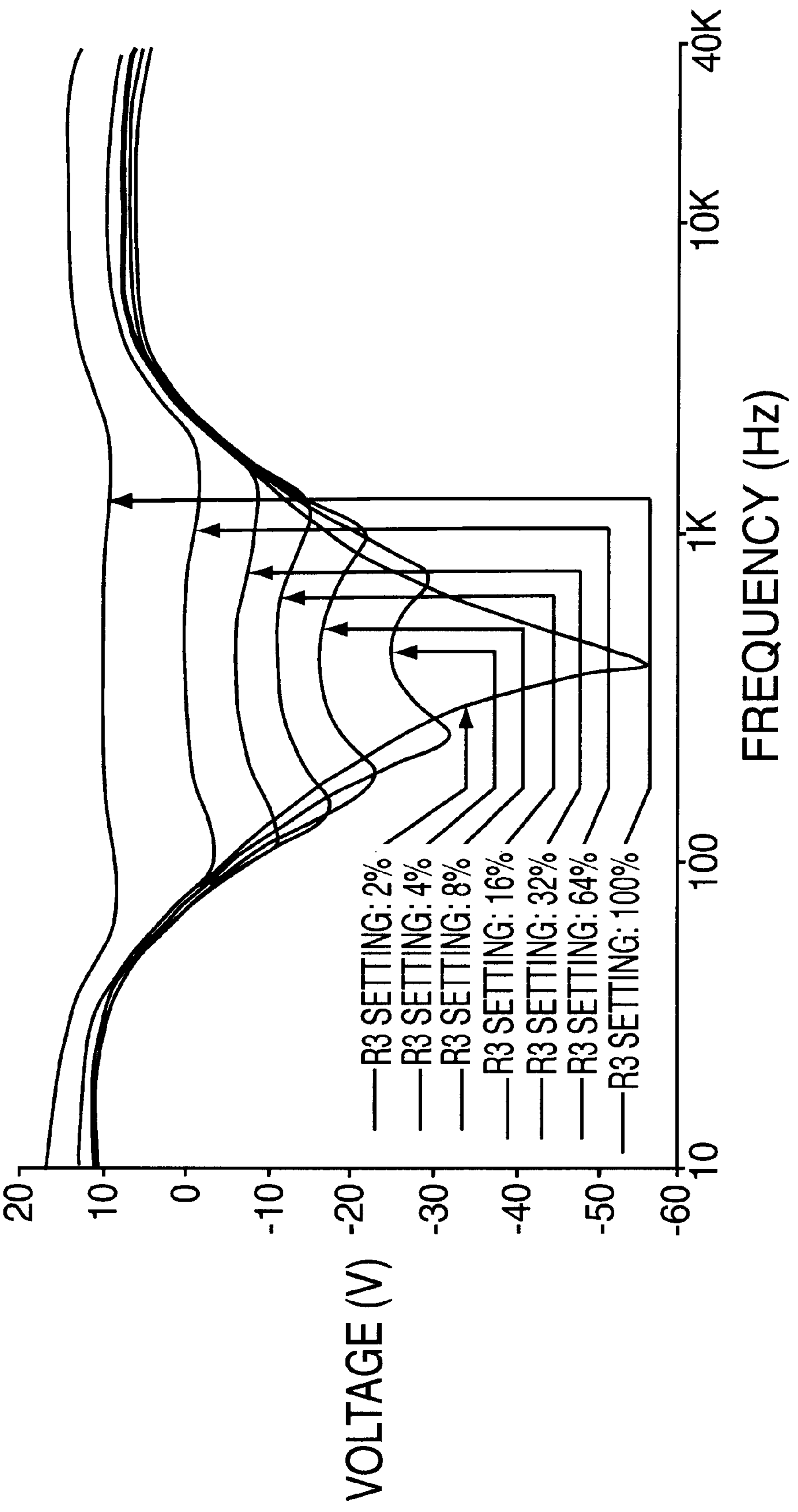
FIG. 4B is a graph which shows the output of the circuit of FIG. 2 while R3 is varied from 2% (maximum cancellation) to 100% (approximates original input signal).

The stopband regions of the combined result become more attenuated, while the passband regions remain largely unaffected, as shown in FIG. 4A. With R3 set at 2%, an equal ratio of in- and out- of phase is reached, and this produces the maximum nadir. Also, with R3 set at 2%, the transition between the high and low passbands and the stop band is at its steepest slope. FIG. 4B shows the results as R3 is increased beyond 2%, where the pre-processor signal from circuit 140 gradually overwhelms the outputs of elements 120 and 130, so that an essentially flat response is eventually reached for R3=100%. If an even 'flatter' response is desired, a method for increasing the ratio of the signal from element 140 to that from elements 120 and 130 can be provided: for example, a gain stage can be added to element 140 so that its signal is significantly greater than the combined outputs of elements 120 and 130, or a bypass switch could be added to eliminate the outputs of elements 120 and 130. Alternatively, R3's value can be limited to values less than 100% for situations where reaching the upper lines of FIG. 4B is preferably avoided.

Figure 5:
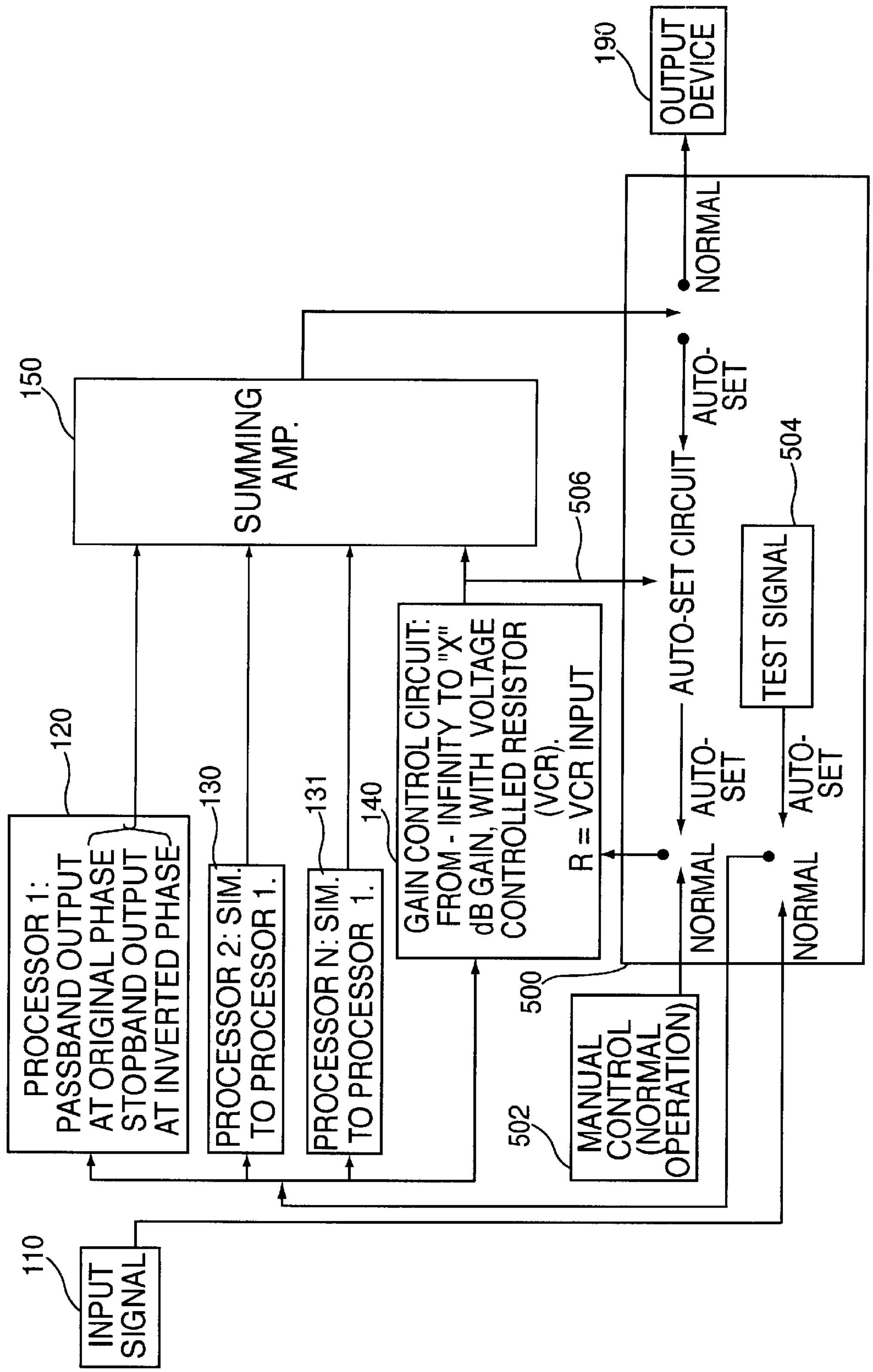
FIG. 5 is a simplified block diagram of the apparatus of FIG. 1, and modified to include the placement of elements required for an implementation of a feature which can automatically seek a maximum of reduction in a stopband.
Figure 6:
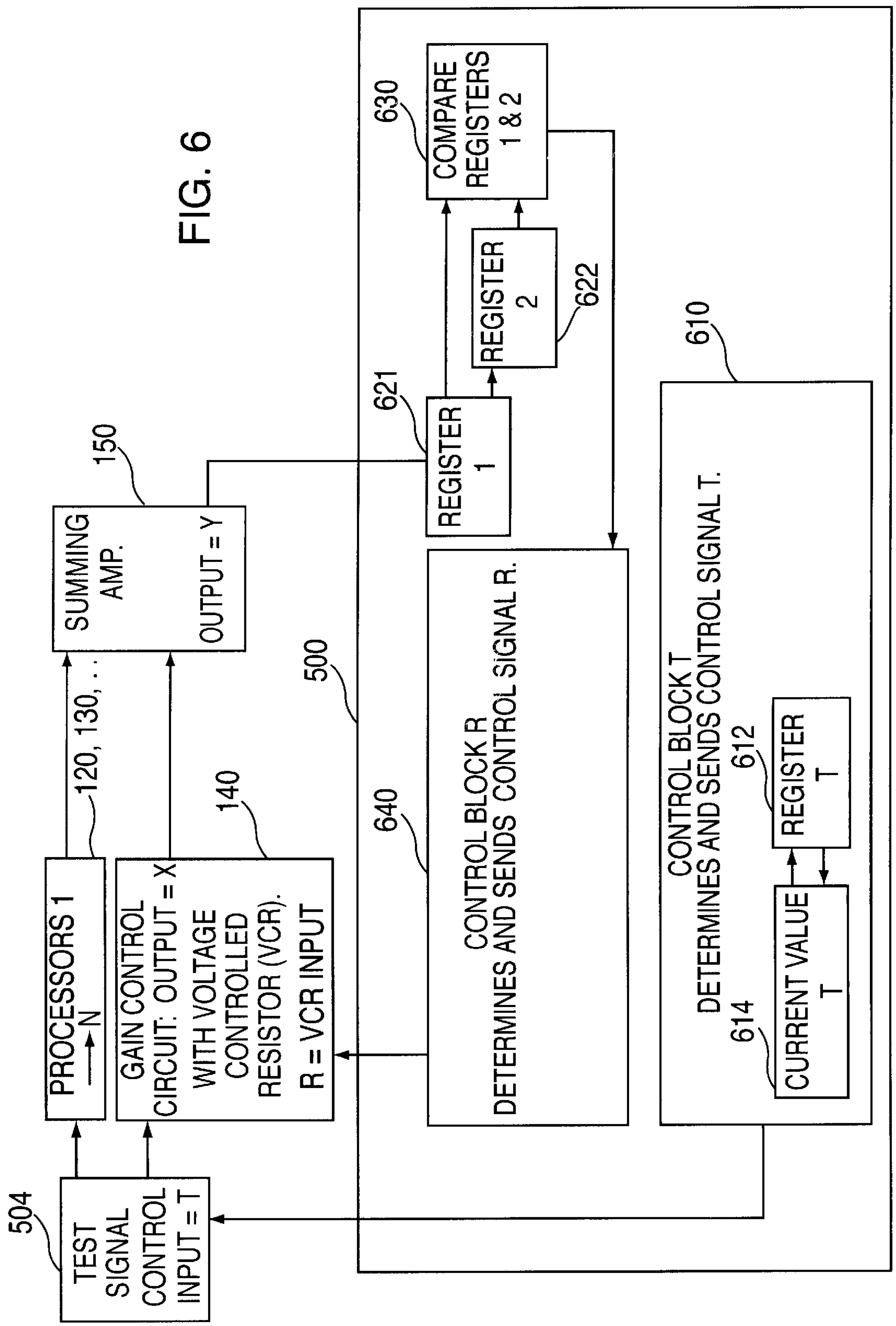
FIG. 6 is a more detailed block diagram of the apparatus of FIG. 5, showing the elements of one implementation of an automatic seek feature in more detail.

Referring to FIG. 5 and FIG. 6, block diagrams are shown of an apparatus that automatically seeks a maximum of rejection in a stopband. In FIG. 5, Gain Control Circuit 140 has been modified to include a voltage controlled resistor, so that its gain can be adjusted by the automatic setting circuit

500. A momentary contact switch (not shown) is pressed by the user, which activates the auto-set circuit. The first action of this circuit is to shift the three shown switches from their positions during normal operation to their positions as needed for the circuit to operate. Input Signal 110 is replaced by a Test Signal 504. Control of Gain Control Circuit 140 is transferred from manual control 502 to the automatic circuit 500. The output of summing amp 150 is removed from output device 190, and is redirected to automatic circuit 500. Arrow 506 shows an extra output signal from gain control circuit 140, directed to automatic circuit 500, which may be required for some implementations of an automatic circuit (though not used for the example of FIG. 6).

FIG, 6 shows one possible implementation of an automatic setting device, which may be used with the circuit of FIG. 2. For this example, we choose the test signal 504 to be a sine wave that can be incremented from 10 Hz to 20 kHz by 1/12 octave steps (=½ step in musical terminology). Control signal T is initialized for a starting frequency of 10 Hz. Control signal R is initialized so that gain control circuit 140's output X is 0 (R=0%). Output Y of summing amp 150 is stored to Register 1 (621), and then copied from there to Register 2 (622). The current value for control signal T (614) is stored in Register T (612).

Control block T (610) then performs the following loop, which sets test signal 504 to the nadir of the stopband:

1- Increment T to yield an increase in the test signal frequency of 1/12 octave

2- Store the value of Y to Register 1 (621)

3- If Register 1<Register 2, then:

a)copy Register 1 to Register 2, and b) store current setting of T in Register T.

4- If T is set for>20 kHz, end loop; otherwise, repeat loop.

The value in Register T is now that value which will set test signal 504 to the nadir of the stopband. The current value 614 for control signal T is now set to be the value in Register T. After this, the value of output Y is stored in Register 1. Control Block R (640) then performs the following loop:

1- Copy Register 1 (621) to Register 2

2- Increment R by one unit to increase output X of circuit 140

3- Store the value of Y to Register 1 (621)

4- If Register 1<Register 2, restart loop

5- If Register 1>Register 2, decrement R to decrease X, then revert to Normal operation.

6- If Register 1 Register 2, revert to Normal operation.

R has now been set to the value which produces the maximum rejection at the stopband frequency set by T. The switches of circuit 500 in FIG. 5 are reset to their "Normal" positions. Manual control 502 can now be used by the operator to make adjustments as deemed necessary. This makes the job of finding the setting of maximum stopband rejection easier, particularly for an inexperienced operator.

Figure 7:
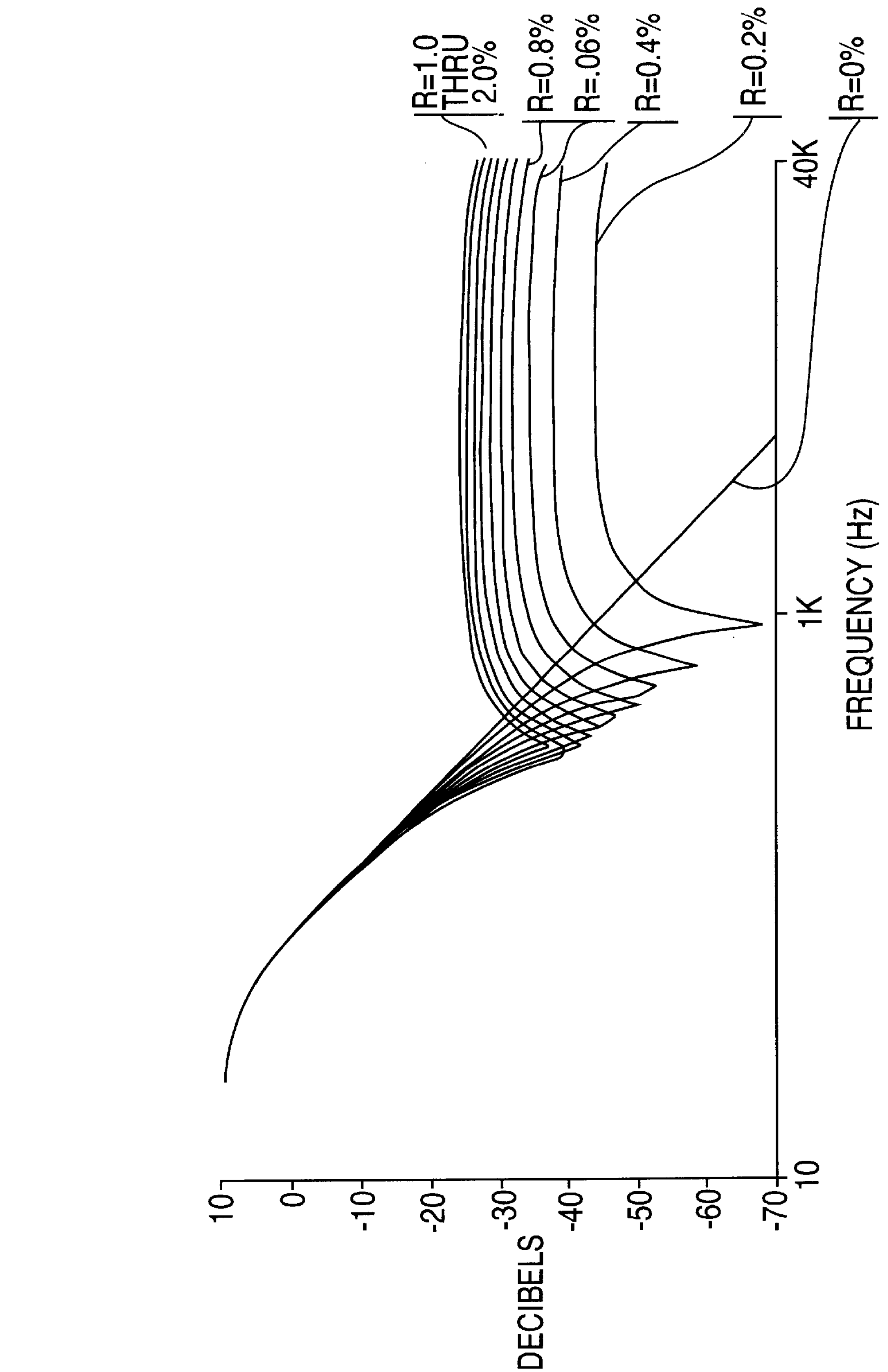
FIG. 7 is a graph which shows the result of a portion of the circuit of FIG. 2 (with the circuit marked 120 removed) while R3 is varied from 0% (no effect) to 2%.

FIG. 7 shows an example of a unique filter response created by the method. The results are from the circuit of FIG. 2, but with the circuit in area 120 removed. The remaining filter circuit 130 is a common $2^{nd}$ order low pass filter, whose unaltered response is seen on FIG. 7 as the line where R=0%. As R is increased, a region is created that is much steeper than the original $2^{nd}$ order filter, though at the expense of a newly added shelf in the high frequency region of this example. Where R=0.2%, the graph shows an extra reduction of about 24 dB for a frequency near 900 Hz. The high frequency shelf that appears remains below –53 dB from the source (which was+10 dB), still more than enough for many applications (most audio applications, for example). This approximates a 'variable depth' low pass filter. Under some circumstances, this would be an excellent filter shape. In general, the new shapes created by the present invention are as diverse as the processors (120,130-5,etc.) with which it is used, but once the signal source and processors are known, the results of the present method can be predicted.

Although embodiments are specifically illustrated and described herein, it will be appreciated that modifications and variations of the present invention are covered by the above teachings and within the purview of the appended claims without departing from the spirit and intended scope of the invention. The embodiments of the present invention allow the phenomenon of phase cancellation to provide a variety of benefits when dealing with wave phenomena. For situations where a continuous control is desired/needed to have a position that affords a pure pre-processor signal at one end of travel, an arrangement is easily made to do so.

What is claimed is:

1. A signal processing device comprising:

at least one filter adapted to receive an input signal and further adapted to phase shift frequency components of said input signal that are in a stopband range of a frequency spectrum, said at least one filter further adapted to output frequency components of said input signal that are in a passband range of the frequency spectrum and said phase shifted frequency components of said stopband range of the frequency spectrum, said at least one filter including a low-pass filter having at least one pole frequency setting and an output gain setting;

a high-pass filter having at least one pole frequency setting and an output gain setting, said high-pass filter in a parallel arrangement with said low-pass filter;

a gain control circuit adapted to receive and variably amplify/attenuate said input signal where the gain of said gain control circuit is dependent on the at least one pole frequency of said low-pass filter; the output gain of said low-pass filter; the at least one pole frequency of said high-pass filter; and the output gain of said high-pass filter; and a summing device coupled to said at least one filter, said summing device adapted to receive and sum said frequency components of an output signal from said at least one filter that are in said passband range of the frequency spectrum; said phase shifted frequency components of said stopband range of the frequency spectrum; and an output signal of said gain control circuit.

2. The signal processing device of claim 1 wherein said at least one filter is adapted to phase shift the frequency components of the input signal that are in the stopband range of the frequency spectrum by 180°.

3. The signal processing device of claim 1 wherein said gain control circuit includes a control element adapted to selectively control a level of amplification for said input signal.

4. The signal processing device of claim 1 further comprising at least one control circuit adapted to variably change said at least one pole frequency of at least one of said low-pass and said high-pass filters.

5. The signal processing device of claim 1 further comprising at least one control circuit adapted to variably amplify/attenuate the output level of at least one of said low-pass and said high-pass filters.

6. The signal processing device of claim 1 wherein said at least one filter is adapted to phase shift the frequency components of the input signal that are in the stopband range of the frequency spectrum by greater than 120 degrees.

7. A method for processing a signal comprising:

providing an input signal to at least one filter;

phase shifting frequency components of said input signal that are in a stopband range of a frequency spectrum with said at least one filter, said at least one filter including a low-pass filter having at least one pole frequency setting and an output gain setting, and a high-pass filter having at least one pole frequency setting and an output gain setting; said high pass-filter in a parallel arrangement with said low-pass filter;

outputting frequency components of said input signal that are in a passband range of the frequency spectrum with said at least one filter;

outputting said phase shifted frequency components of said stopband range of the frequency spectrum;

amplifying said input signal, said amplification based on said at least one pole frequency of said low-pass filter; the output gain of said low-pass filter; the at least one pole frequency of said high-pass filter; and the output gain of said high-pass filter; and summing said frequency components of an output signal of said at least one filter that are in said passband range of the frequency spectrum said phase shifted frequency components of the stopband range of the frequency spectrum, and said amplified input signal.

8. The method of claim 7 wherein said phase shifting step, said frequency component of said input signal in the stopband range of the frequency spectrum are phase shifted by 180°.

9. The method of claim 7 wherein a level of said amplification for said input signal is selected using a control element in a gain control circuit.

10. The method of claim 7 further comprising:

variably changing said at least one pole frequency of at least one of said low-pass and said high-pass filters with a control circuit.

11. The method of claim 7 further comprising:

variably amplifying/attenuating the output level of at least one of said low-pass and said high-pass filters with a control circuit.

12. The method of claim 7 wherein in said phase shifting step, said frequency components of said input signal in the stopband range of the frequency spectrum are phase shifted by greater than 120 degrees.

13. A signal processing device comprising:

at least one filter adapted to receive an input signal and further adapted to phase shift frequency components of said input signal that are in a stopband range of a frequency spectrum by greater than 120 degrees of shift, said at least one filter further adapted to output frequency components of said input signal that are in a passband range of the frequency spectrum and said phase shifted frequency components of said stopband range of the frequency spectrum, said at least one filter including a low-pass filter having at least one pole frequency setting and an output gain setting, a high-pass filter having at least one pole frequency setting and an output gain setting, said high-pass filter in a parallel arrangement with said low-pass filter; and a summing device coupled to said at least one filter, said summing device adapted to receive and sum said frequency components of an output signal from said at least one filter that are in said passband range of the frequency spectrum; said phase shifted frequency components of said stopband range of the frequency spectrum; and said input signal.

14. The signal processing device of claim 13 wherein said at least one filter is adapted to phase shift the frequency components of the input signal that are in the stopband range of the frequency spectrum by 180°.

15. The signal processing device of claim 13 further comprising:

a gain control circuit adapted to receive and variably amplify/attenuate said input signal wherein said summing device receives said input signal via said gain control circuit.

16. The signal processing device of claim 15 wherein said gain control circuit includes a control element adapted to selectively control a level of amplification for said input signal.

17. The signal processing device of claim 15 wherein the gain of said gain control circuit is dependent on the at least one pole frequency of said low-pass filter; the output gain of said low-pass filter; the at least one pole frequency of said high-pass filter; and the output gain of said high-pass filter.

18. The signal processing device of claim 13 further comprising at least one control circuit adapted to variably change said at least one pole frequency of at least one of said low-pass and said high-pass filters.

19. The signal processing device of claim 13 further comprising at least one control circuit adapted to variably amplify/attenuate the output level of at least one of said low-pass and said high-pass filters.

20. A method for processing a signal comprising:

providing an input signal to at least one filter;

phase shifting, by greater than 120 degrees, frequency components of said input signal that are in a stopband range of a frequency spectrum with said at least one filter, said at least one filter including: a low-pass filter having at least one pole frequency setting and an output gain setting, and a high-pass filter having at least one pole frequency setting and an output gain setting; said high-pass filter in a parallel arrangement with said low-pass filter;

outputting frequency components of said input signal that are in a passband range of the frequency spectrum with said at least one filter;

outputting said phase shifted frequency components of said stopband range of the frequency spectrum; and summing said frequency components of an output signal of said at least one filter that are in said passband range of the frequency spectrum and the phase shifted frequency components of the stopband range of the frequency spectrum with the input signal.

21. The method of claim 20 wherein in said phase shifting step, said frequency components of said input signal in the stopband range of the frequency spectrum are phase shifted by 180°.

22. The method of claim 20 further comprising:

amplifying said input signal in a gain control circuit.

23. The method of claim 22 wherein a level of said amplification for said input signal is selected using a control element in said gain control circuit.

24. The method of claim 22 further comprising:

controlling the gain of said gain control circuit based on the at least one pole frequency of said low-pass filter; the output gain of said low-pass filter; the at least one pole frequency of said high-pass filter; and the output gain of said high-pass filter.

25. The method of claim 20 further comprising:

variably changing said at least one pole frequency of at least one of said low-pass and said high-pass filters with a control circuit.

26. The method of claim 20 further comprising:

variably amplifying/attenuating the output level of at least one of said low-pass and said high-pass filters with a control circuit.

27. A signal processing device comprising:

at least one filter adapted to receive an input signal and further adapted to phase shift frequency components of said input signal that are in a stopband range of a frequency spectrum, said at least one filter further adapted to output frequency components of said input signal that are in a passband range of the frequency spectrum and said phase shifted frequency components of said stopband range of the frequency spectrum, said at least one filter including a low-pass filter having at least one pole frequency setting and an output gain setting, a high-pass filter having at least one pole frequency setting and an output gain setting, said high-pass filter in a parallel arrangement with said low-pass filter, a summing device coupled to said at least one filter, said summing device adapted to receive and sum said frequency components of an output signal from said at least one filter that are in said passband range of the frequency spectrum; said phase shifted frequency components of said stopband range of the frequency spectrum; and said input signal; and a gain control circuit adapted to receive and variably amplify/attenuate said input signal wherein said summing device receives said input signal via said gain control circuit, said gain control circuit further adapted to both increase and decrease the output of said summing device in said stopband range of the frequency spectrum, said gain control circuit able to reduce level in said stopband range greater than a reduction in level provided by said at least one filter alone.

28. The signal processing device of claim 27 wherein said at least one filter is adapted to phase shift the frequency components of the input signal that are in the stopband range of the frequency spectrum by greater than 120 degrees.

29. The signal processing device of claim 27 wherein said at least one filter is adapted to phase shift the frequency components of the input signal that are in the stopband range of the frequency spectrum by 180°.

30. The signal processing device of claim 27 wherein said gain control circuit includes a control element adapted to selectively control a level of amplification for said input signal.

31. The signal processing device of claim 27 wherein the gain of said gain control circuit is dependent on the at least one pole frequency of said low-pass filter; the output gain of said low-pass filter; the at least one pole frequency of said high-pass filter; and the output gain of said high-pass filter.

32. The signal processing device of claim 27 further comprising at least one control circuit adapted to variably change said at least one pole frequency of at least one of said low-pass and said high-pass filters.

33. The signal processing device of claim 27 further comprising at least one control circuit adapted to variably amplify/attenuate the output level of at least one of said low-pass and said high-pass filters.

34. A method for processing a signal comprising:

providing an input signal to at least one filter;

phase shifting frequency components of said input signal that are in a stopband range of a frequency spectrum with said at least one filter, said at least one filter including: a low-pass filter having at least one pole frequency setting and an output gain setting, and a high-pass filter having at least one pole frequency setting and an output gain setting; said high-pass filter in a parallel arrangement with said low-pass filter;

outputting frequency components of said input signal that are in a passband range of the frequency spectrum with said at least one filter;

outputting said phase shifted frequency components of said stopband range of the frequency spectrum;

amplifying said input signal in a gain control circuit; and summing said frequency components of an output signal of said at least one filter that are in said passband range of the frequency spectrum, said phase shifted frequency components of the stopband range of the frequency spectrum, and an output of said gain control circuit, said gain control circuit further adapted to both increase and decrease the resulting output of said summing step in said stopband range of the frequency spectrum, said gain control circuit able to produce a reduction of the level in said stopband range greater than a reduction in level provided by said at least one filter alone.

35. The method of claim 34 wherein in said phase shifting step, said frequency components of said input signal in the stopband range of the frequency spectrum are phase shifted by greater than 120 degrees.

36. The method of claim 34 wherein in said phase shifting step, said frequency components of said input signal in the stopband range of the frequency spectrum are shifted by 180°.

37. The method of claim 34 wherein a level of said amplification for said input signal is selected using a control element in said gain control circuit.

38. The method of claim 34 further comprising:

controlling the gain of said gain control circuit based on the at least one pole frequency of said low-pass filter; the output gain of said low-pass filter; the at least one pole frequency of said high-pass filter; and the output gain of said high-pass filter.

39. The method of claim 34 further comprising:

variably changing said at least one pole frequency of at least one of said low-pass and said high-pass filters with a control circuit.

40. The method of claim 34 further comprising:

variably amplifying/attenuating the output level of at least one of said low-pass and said high-pass filters with a control circuit.

* * * * *